United States Patent [19]

Gazit et al.

[11] Patent Number: 4,647,508
[45] Date of Patent: Mar. 3, 1987

[54] FLEXIBLE CIRCUIT LAMINATE

[75] Inventors: Samuel Gazit, Willimantic; Thomas S. Kneeland, Woodstock, both of Conn.

[73] Assignee: Rogers Corporation, Rogers, Conn.

[21] Appl. No.: 755,067

[22] Filed: Jul. 15, 1985

Related U.S. Application Data

[63] Continuation-in-part of Ser. No. 629,164, Jul. 9, 1984, abandoned.

[51] Int. Cl.⁴ .................... B32B 27/08; B32B 15/08
[52] U.S. Cl. .................................. 428/421; 428/422; 428/432; 428/442; 428/463; 428/473.5; 428/520; 428/901
[58] Field of Search ............ 428/422, 421, 901, 473.5, 428/432, 463, 442, 520

[56] References Cited

U.S. PATENT DOCUMENTS 3,676,566  7/1972  McBride .............. 428/473.5 X
3,770,566 11/1973  Gerow et al. ............ 428/421 X
4,050,976  9/1977  Reiters ................... 428/901 X
4,431,698  2/1984  Case et al. .............. 428/422 X Primary Examiner—Thomas J. Herbert
Attorney, Agent, or Firm—Fishman & Dionne

[57] ABSTRACT

A flexible circuit laminate is presented comprising a microglass reinforce fluoropolymer layer sandwiched between a fluoropolymer coated polyimide and a copper conductive pattern. The glass reinforced fluoropolymer acts as a high bond strength adhesive between the fluoropolymer coated polyimide and copper conductive pattern. The glass reinforced fluoropolymer also contributes to improved dimensional stability as well as improved electrical performance. Preferably, the microglass content is between about 4 to about 30 weight percent, and more preferably about 20 weight percent glass.

22 Claims, 14 Drawing Figures

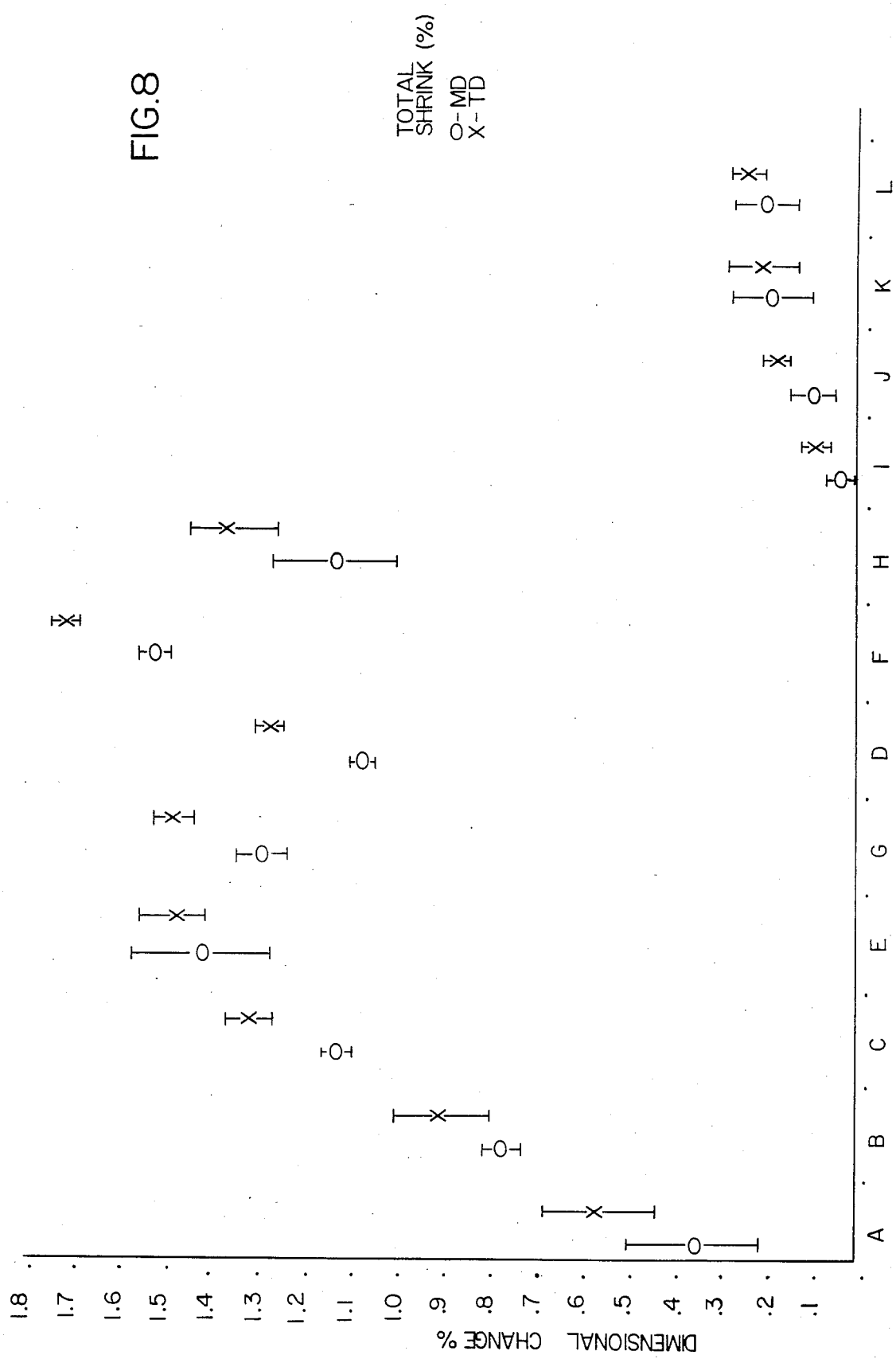

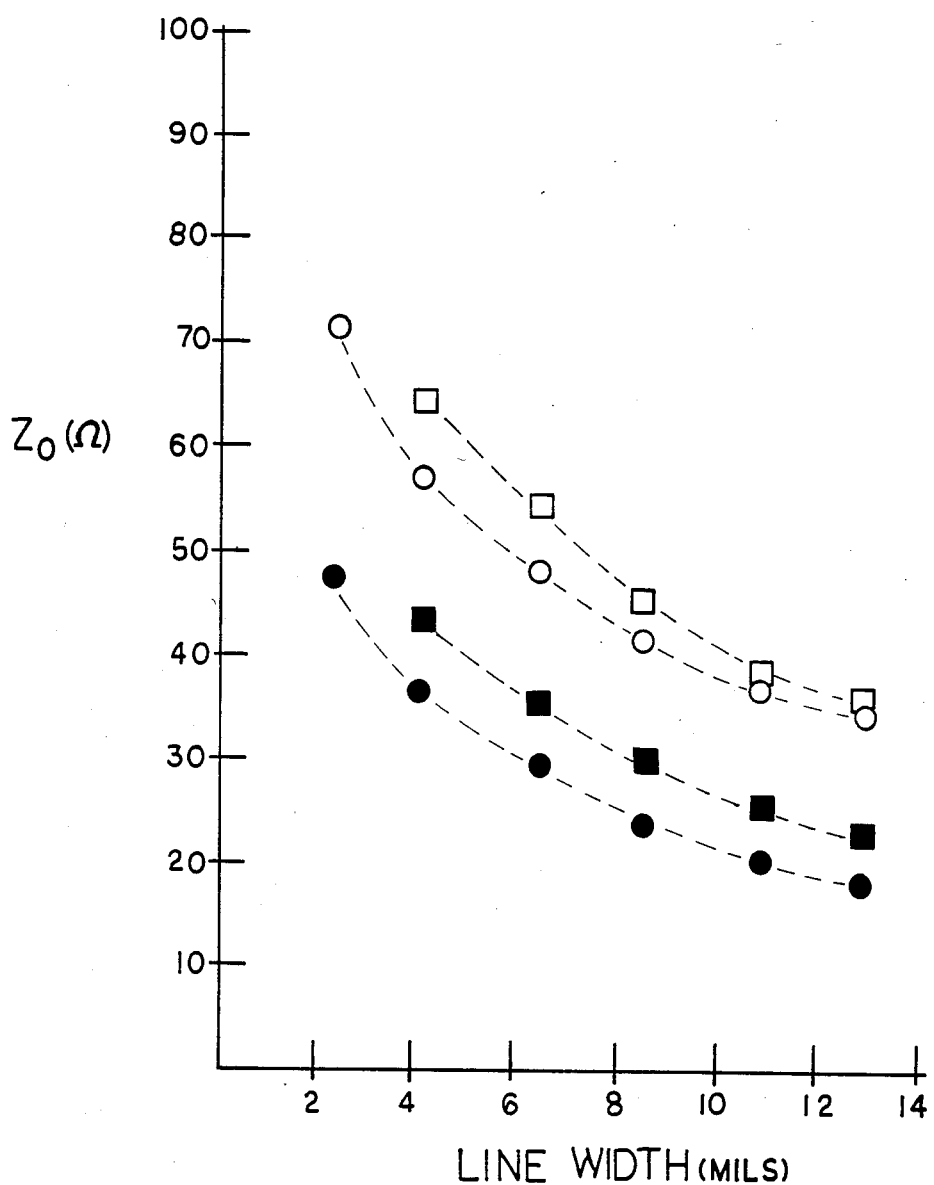

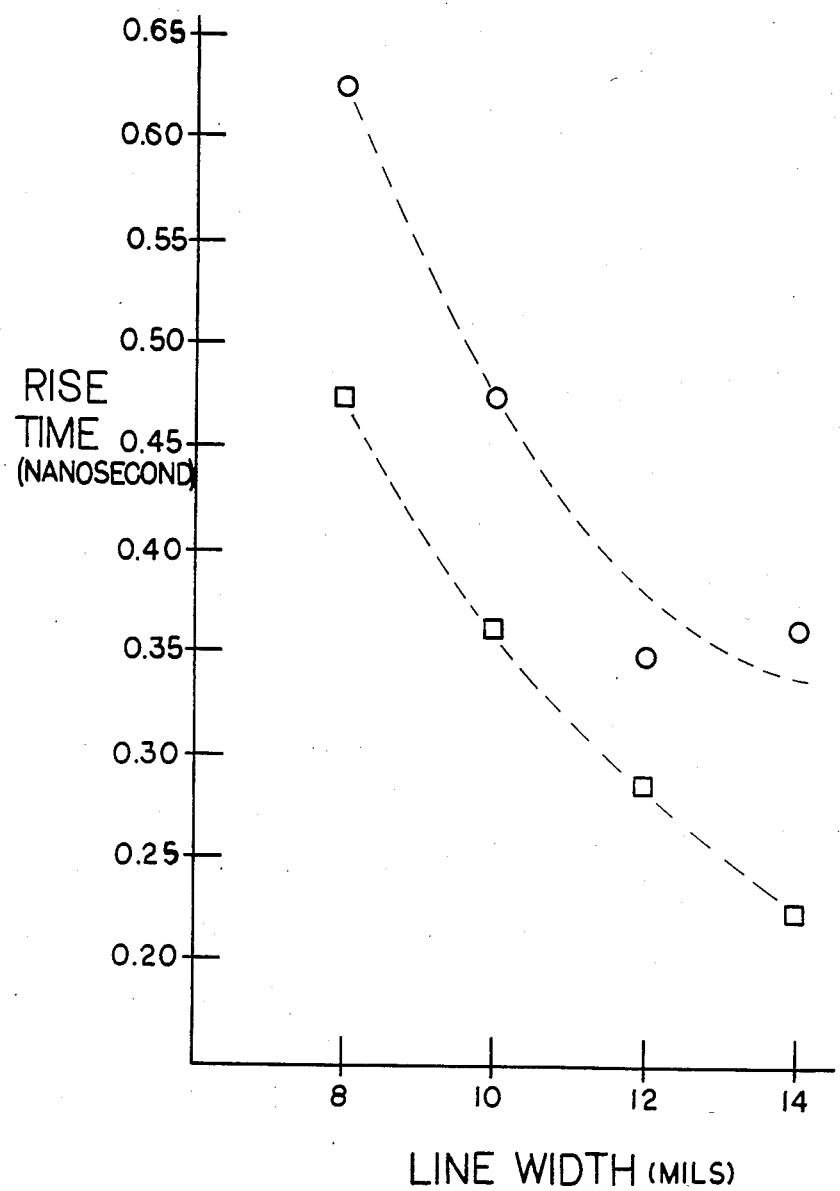

FLEXIBLE CIRCUIT LAMINATE

BACKGROUND OF THE INVENTION

This invention relates to the field of laminar sheet material. More particularly, this invention relates to the field of laminar circuit sheet material comprised of a fluoropolymer/glass composite layer sandwiched between a fluoropolymer coated polyimide film and a copper foil.

Conventional flexible circuitry comprised of polyimide film such as DuPont's Kapton film adhesively bonded to thin metal foil, usually copper, is well known to those skilled in the art. Typically, a conductor pattern is printed on the copper with an etch resistant coating, the unnecessary copper subsequently being etched away. While finding great application, this conventional flex circuitry suffers from certain drawbacks and deficiencies. For example, substrate materials having lower dielectric constants will offer less interference to electronic signals traveling through the conductors especially at high frequency. The dielectric constant of conventionally used polyimide substrate film such as Kapton, is typically 3.5 (dielectric constant of Kapton is dependent on humidity). With the increasing use of high speed signals, the relatively high dielectric constant of polyimide substrates create undesirable effects. Consequently, a substrate material having a lower dielectric constant, i.e., less than about 2.5, would be highly desirable from at least the standpoint of offering less resistance to electronic signals.

Another common problem with polyimide based flex circuitry is found in the necessary adhesive associated therewith. Adhesives between the polyimide film and copper conductors may be adversely affected by high temperature.

One way of overcoming the above discussed resistance problem is to cover the polyimide film with a material having a relatively lower dielectric constant and which does not need an adhesive bond. Fluoropolymers are materials which satisfy these two requirements. In fact, laminar structures of polyimide and fluorocarbon polymers have been described in U.S. Pat. Nos. 3,676,566 and 3,770,566 assigned to E.I. duPont de Nemours and Company. Commercially, polyimide/fluoropolymer laminates are well known and available from the E.I. duPont de Nemours and Company under the trademarks Kapton F and Kapton XP.

Unfortunately, while fluoropolymer coated polyimides (such as Kapton F or Kapton XP) provide an improved, i.e., lower, dielectric constant than conventional polyimide (Kapton) film, other serious problems associated with fluoropolymers are presented. The two most important problems involve poor dimensional stability of the fluoropolymer and poor adhesion or bond strength between the copper conductors and the fluoropolymer film.

SUMMARY OF THE INVENTION

The above discussed and other problems of the prior art are overcome or alleviated by the laminar circuit sheet material of the present invention. In accordance with the present invention, a novel layer of microglass reinforced fluoropolymer is sandwiched between a fluoropolymer coated polyimide laminate, i.e., Kapton F or Kapton XP, and a copper conductive pattern. In essence, the fluoropolymer/microglass film of the present invention acts as a bonding layer or adhesive which greatly improves the bond strength between, for example, the Kapton F or XP and the etched copper conductors.

Moreover, use of microglass reinforced fluoropolymer film not only improves the bond between, for example, Kapton F or XP and copper foil, but also, and just as significantly, improves the overall dimensional stability of the laminate. This improved dimensional stability is of particular importance, since, as mentioned, fluoropolymers (and even polyimide) suffer from poor and at times, unacceptable dimensional stability.

Furthermore, the microglass reinforced fluoropolymer bonding layer also provides improved temperature characteristics to the laminated circuit sheet of the present invention.

Thus, the laminate of the present invention results in a lower dielectric constant relative to conventional polyimide (Kapton) film based flexible circuit material. Also, the dimensional stability and bond strength to copper foil in the laminate of the instant invention are improved relative to fluoropolymer coated polyimides such as Kapton F or XP.

The above discussed and other advantages of the present invention will be apparent to and understood by those skilled in the art from the following detailed description and drawings.

BRIEF DESCRIPTION OF THE DRAWINGS

Referring now to the drawings, wherein like elements are numbered alike in the several FIGURES:

FIG. 4A is a cross-sectional elevation view of a variation of the embodiment of FIG. 4.

FIG. 8 is a graphical representation showing the dimensional stability of laminates in accordance with the present invention.

FIG. 10 is a graphical representation of characteristic impedance vs. line width for stripline and microstrip constructions of both the present invention and the prior art laminate of FIG. 1.

FIG. 11 is a graphical representation of output signal rise time vs. line width for stripline constructions of both the present invention and the prior art laminate of FIG. 1.

DESCRIPTION OF THE PREFERRED EMBODIMENT

Figure 1:
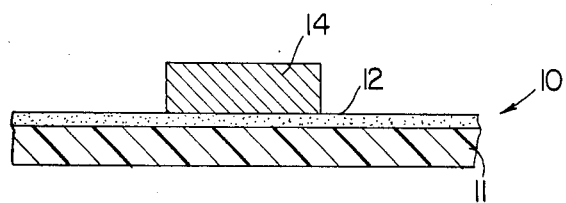
FIG. 1 is a cross-sectional elevation view of a copper/adhesive/polyimide laminate in accordance with the prior art.
Figure 2:
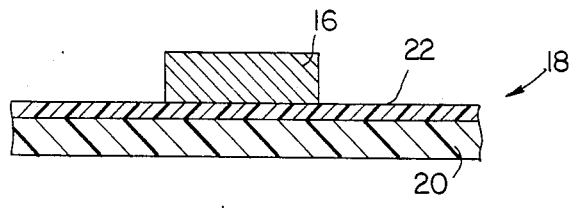
FIG. 2 is a cross-sectional elevation view of a copper/fluorocarbon/polyimide laminate in accordance with the prior art.

Referring first to FIGS. 1 and 2, two examples of prior art laminar circuit sheet material are shown. In FIG. 1, a conventional flexible circuit sheet is shown having a substrate or base layer 10 comprised of a polyimide film 11 such as Kapton film bonded by a generally acrylic or epoxy adhesive 12 to a copper conductor 14. As already mentioned, conventional flex circuitry is associated with certain problems and deficiencies. One such problem is the relatively high dielectric constant of the Kapton film, i.e., typically 3.5 and of the adhesive layer. It is well known that lowering the dielectric constant of the circuit substrate material will result in less interference of the base material with the electronic signals passing through the copper conductors at high frequency. It would be advantageous therefore, to improve conventional flex circuitry such as shown in FIG. 1 by lowering the dielectric constant of the substrate material.

Another problem associated with the flex circuitry of FIG. 1 is the adhesive layer 12. Adhesive materials in the circuit laminate may be adversely affected by high temperatures.

One attempt at overcoming the deficiencies of the circuit laminate of FIG. 1 is shown by the fluorocarbon containing circuit laminate of FIG. 2. In FIG. 2, a copper conductor 16 is positioned on a substrate material 18 comprised of a polyimide film 20 such as Kapton having a layer of fluorocarbon film 22 thereon. Substrate layer 18 is a well known material commercially available as KAPTON F (hereinafter referred to as KF) or KAPTON XP (hereinafter referred to as KXP) manufactured by the E.I. duPont De Nemours & Co. KAPTON F is comprised of a KAPTON polyimide film Type H coated on one or two sides with TEFLON FEP fluorocarbon resin. Kapton XP is comprised of a Kapton polyimide film Type H coated on one or two sides with TEFLON PFA fluorocarbon resin. Fluorocarbon polymers have a relatively low dielectric constant, i.e., less than 2.5 and high temperature characteristics. Accordingly, substrate material 18 will exhibit improved dielectric characteristics, i.e., a lower dielectric constant relative to other conventional substrates such as substrate material 10 in FIG. 1. Moreover, substrate 18 does not necessitate an intermediate adhesive layer and the problems associated therewith as the thermoplastic fluorocarbon polymer acts as its own adhesive material.

However, while providing some improved characteristics over the FIG. 1 prior art, the fluorocarbon/polyimide substrate 18 of FIG. 2 suffers from certain other important deficiencies. For example, while the fluorocarbon polymer 22 imparts improved dielectric characteristics and satisfies the need for adhesive, it is well known that fluorocarbon polymeric materials exhibit extremely poor dimensional stability and relatively poor bond strength (i.e., peel strength) to copper. Obviously, these negative features of fluorocarbons are imparted to substrate 18. Even the composite dielectric materials of Kapton and fluorocarbon such as Kapton F and Kapton XP suffer from poor dimensional stability and poor bonding to copper conductors.

The novel laminar circuit sheet material in accordance with the present invention overcomes the problem associated with the prior art circuit material in FIGS. 1 and 2 by providing a novel glass reinforced fluorocarbon layer between, for example, the substrate material 18 and the copper conductor 16 in FIG. 2. This glass reinforced fluorocarbon polymer functions to improve the circuit material of FIG. 2 in at least two respects. First, the additive layer acts as an adhesive and greatly improves the bond strength between the copper and fluoropolymer coated Kapton. Second, dimensional stability of the laminate is dramatically improved, while retaining the improved electrical properties.

Figure 3:
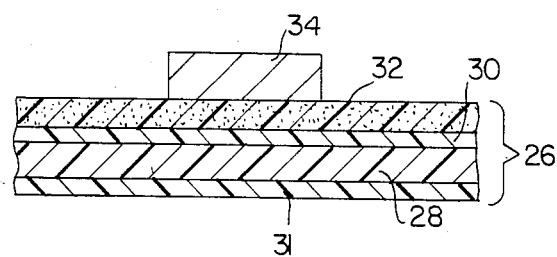
FIG. 3 is a cross-sectional elevation view of a copper/fluorocarbon/polyimide laminate in accordance with the present invention.

Referring now to FIG. 3, one embodiment of the present invention is shown. In accordance with the present invention, substrate 26 is comprised of a polyimide film 28 sandwiched between two layers of polyfluorocarbon film 30 and 31, film 30, in turn, having a layer of microglass reinforced fluorocarbon polymer 32 thereon. Finally, copper conductor 34, is laminated to the novel microglass fluoropolymer layer 32. It will be appreciated that polyimide film 28 and polyfluorocarbon layer 30 is analogous to the substrate 18 (Kapton F or Kapton XP) of FIG. 2. It will also be appreciated that polyfluorocarbon film 31 is an optional layer and may not be necessary for many constructions and applications.

Figure 4:
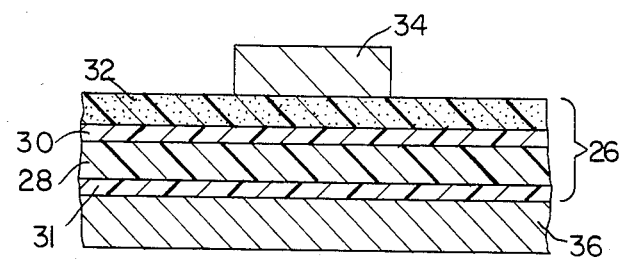
FIG. 4 is a cross-sectional elevation view of another embodiment of the copper/fluorocarbon/polyimide laminate in accordance with the present invention.

FIGS. 4–7 and 4A–7A are alternative embodiments of other laminar circuit sheet materials in accordance with the present invention. It should be understood that all of these embodiments have in common the basic substrate layer 26 of FIG. 3. The embodiment of FIG. 4 is similar to FIG. 3, except for the added metal conductive layer 36 separated by polyfluorocarbon layer 31. This configuration is known in the art as a microstrip without coverfilm. It will be appreciated that the novel microglass reinforced polyfluorocarbon layer 32 will be equally effective in improving bonding and dimensional stability if provided between conductive layer 36 and polyfluorocarbon layer 31. Accordingly, in FIG. 4A, adhesive layer 32' has been added between laminate sheets 31 and 36.

Figure 5:
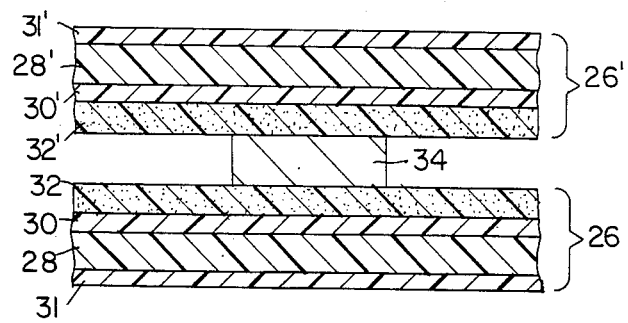
FIG. 5 is a cross-sectional elevation view of still another embodiment of the copper/fluorocarbon/polyimide laminate in accordance with the present invention.
Figure 4:
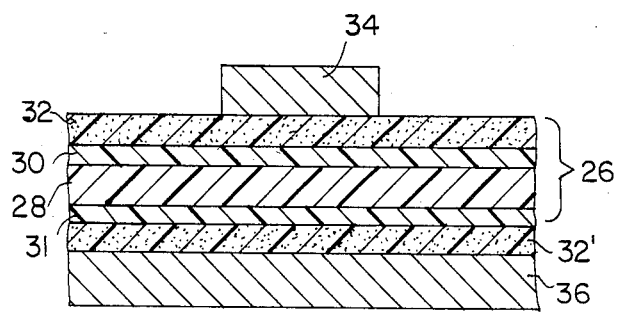
Figure 6:
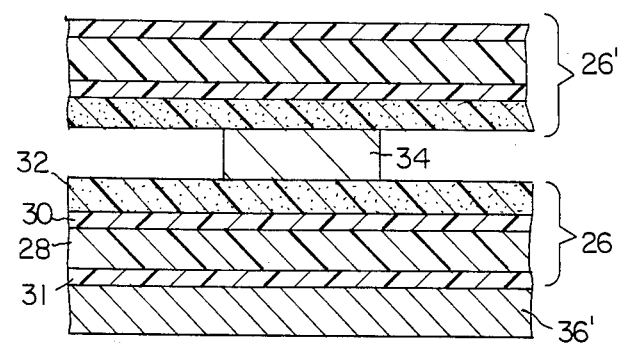
FIG. 6 is a cross-sectional elevation view of yet another embodiment of the copper/fluorocarbon/polyimide laminate in accordance with the present invention.
Figure 6A:
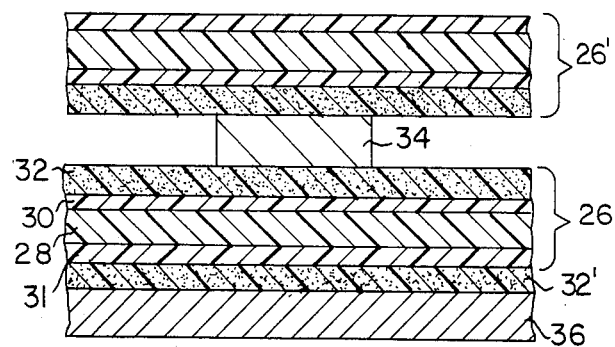
FIG. 6A is a cross-sectional elevation view of a variation of the embodiment of FIG. 6.

In FIG. 5, the flex circuit of FIG. 3 is provided with an identical laminated structure 26' sandwiching the copper conductor 34 therebetween. The flex circuit of FIG. 5 is a "non shielded" laminate construction with a cover film. FIGS. 6 and 6A are microstrip configurations similar to FIG. 4, but including the coverfilm layer 26' of FIG. 5. Thus, a conductive layer 36' has been added to the lower surface of fluorocarbon polymer layer 31. As in FIG. 4A, an additional layer of glass reinforced fluorocarbon 32' is preferably provided between layers 31 and 36 as shown in FIG. 6A.

Figure 7:
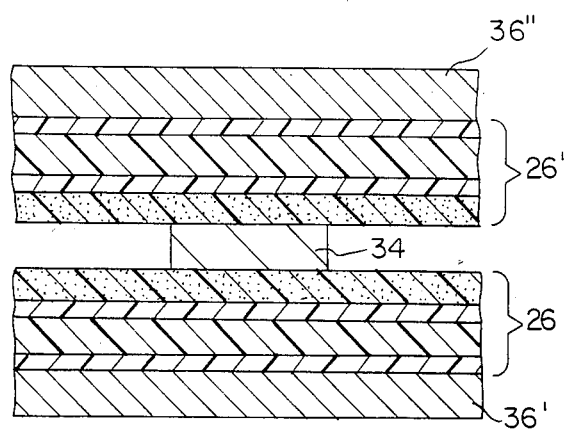
FIG. 7 is a cross-sectional elevation view of still another embodiment of the copper/fluorocarbon/polyimide laminate in accordance with the present invention.
Figure 7A:
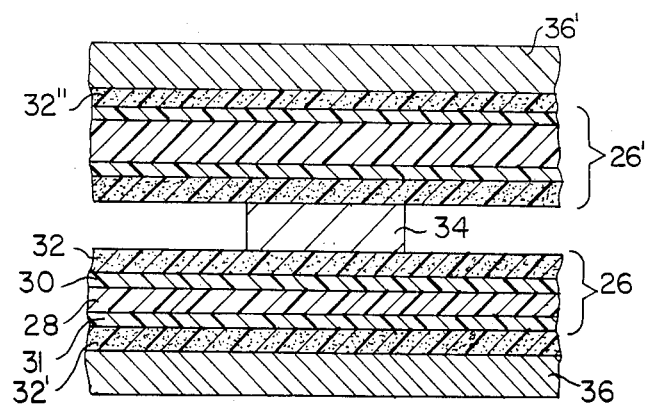
FIG. 7A is a cross-sectional elevation view of a variation of the embodiment of FIG. 7.

Finally, in FIGS. 7 and 7A, an additional copper or other metal sheet 36' has been added to the microstrip laminate of FIG. 6 to form a well known stripline configuration. Both microstrip and stripline laminate configurations find great use in applications which require high electronic signal speed and preferably substrates having low dielectric constants. Accordingly, the circuit laminate of the present invention is extremely well suited for electronic devices and other applications using high speed digital signals.

EXAMPLES

All of the laminate examples used herein were prepared in accordance with the following lamination procedure:

(1) Copper and substrate materials were stacked up in the desired configuration or package. The base polyimide/fluoropolymer substrate consisted of either the prebonded, commercially available Kapton F or Kapton XP or alternatively, separate layers of polyimide film, i.e., Kapton and fluoropolymer film, i.e., TEFLON PFA, TEFLON FEP, PTFE, etc. stacked together and laminated under high temperature and pressure. Steel caul plates were used between panels to insure smooth surfaces on the panels and even distribution of pressure.

(2) The package of material was then placed in a press, brought up to laminating pressure (200–350 psi) and heated to laminating temperature (280° C.–387° C.) The laminating temperature and pressure were maintained for the desired soak time, i.e., about 20 minutes, and thereafter cooled (while still under pressure) to below about 150° C.

I. MECHANICAL PROPERTIES:

A. Bond Strength

In the following examples A–L, the bond or peel strength between the copper foil conductors and the flex circuitry of the present invention were measured for a variety of laminate materials. The experiments were conducted in accordance with the Institute for Interconnecting and Packaging Electronic Circuits (IPC) Test Method No. 2.4.9, Revision A, dated December 1982, the contents of which are incorporated herein by reference.

Referring to TABLE I, the peel strength results for both cut and etched (see noted IPC test method) laminates clearly reveal the improved bonding which the glass reinforced fluoropolymer layer imparts to the laminate material relative to the control Kapton F and Kapton XP laminates. The peel strength and hence, the bond between the copper foil and the KF or KXP is dramatically improved relative to the control group (Examples A and B) of copper directly bonded to KF and KXP. Thus, Examples I–L have peel strengths ranging from about 8.2 lb/in. width to about 10.2 lb/in. width as opposed to values of 2.6 and 4.0 lb/in. width for the control Examples A and B (Kapton F and Kapton XP).

The novel adhesive layer used in accordance with the present invention thus far has shown excellent results with three types of microglass reinforced fluoropolymer including polytetrafluoroethylene (PTFE), flourinated ethylene-propylene copolymer (Teflon FEP) and Teflon PFA, a copolymer having a tetraflouroethylene backbone with a fully flourinated alkoxy side chain. The microglass is preferably of the type produced by Johns-Manville Corporation of Denver, Colo. It is well known that such microglass has a short, noncontinuous configuration (as opposed to continuous glass fibers or strands).

Preferably, 20 weight percent microglass should be used in connection with the fluoropolymer layer, although 4–30 weight percent have also resulted in improved bonding. It will be appreciated that higher amounts of glass will reduce the overall flexibility of the circuit laminate. In order to maintain requisite flexibility, the thickness of each layer in the laminate should be minimized. Examples of preferred thicknesses for the base laminate 26 of FIG. 3 is between about 0.001 inch to about 0.010 inch.

While the inventor has no conclusive theoretical analysis for the dramatic improvements of the present invention, it is postulated that the short fibers in the reinforced fluorocarbon composite improve the bond strength between the dielectric film and the copper foil via a mechanical interlock. It should be understood that the above is only a postulation and the inventor will not be held to this theory.

B. Dimensional Stability

In Examples A–L, the dimensional stability of fluoropolymer/polyimide laminates in accordance with the present invention were compared to a variety of other prior art laminate materials. The examples were conducted in accordance with the IPC Test Method No. 2.2.4, Revision A, dated December, 1982, the contents of which are incorporated herein by reference.

Figure 9:
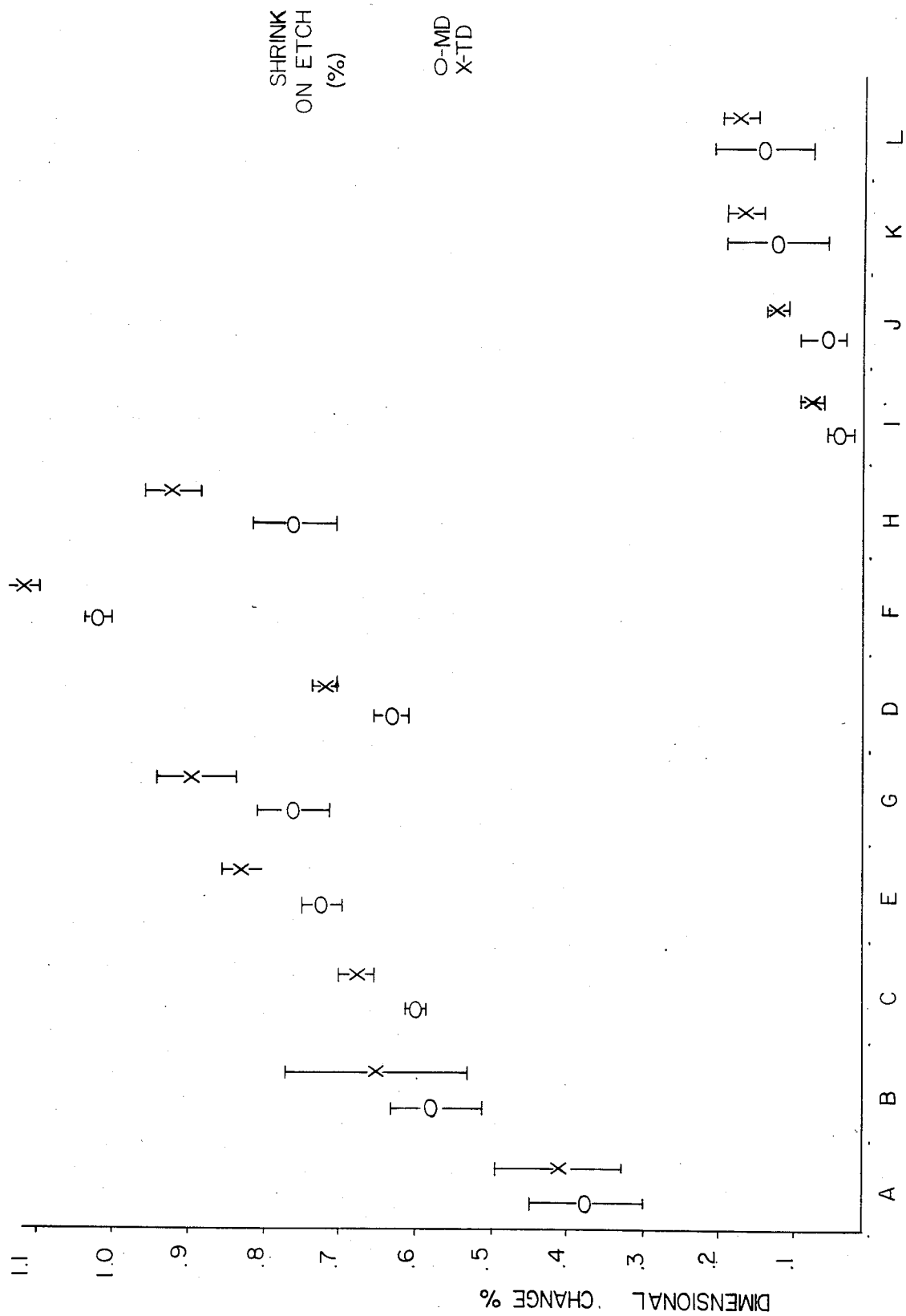
FIG. 9 is another graphical representation showing the dimensional stability of laminates in accordance with the present invention.

Referring to TABLE II and FIGS. 8 and 9, the results therein show dramatic improvements of the present invention for both total shrinkage and shrinkage (see noted IPC test method) on etch (in the machine and transverse dimensions) as compared to the control group (Example A-KF or Example B-KXP) and the nonglass reinforced fluoropolymer laminates (Examples G–H). Thus, the average dimensional changes for laminates of the present invention is between −0.022% to −0.131% on etch in the machine dimension (MD) as compared to about −0.370% and −0.573% for the KF and KXP, respectively.

Interestingly enough, unlike the results of the peel strength examples, merely using PTFE, FEP or PFA film without glass reinforcement does not provide any improvement over the prior art and, in fact, causes even greater shrinkage.

TABLE I

| Material | Peel Strength Test Results (lb/in width) | Example |
|---|---|---|
| Kapton F | 2.6 ± 1.3 | A |
| Kapton XP | 4.0 ± 0.8 | B |
| KF + FEP film | 2.6 ± 0.6 | C |
| KXP + FEP film | 4.0 ± 1.5 | D |
| KF + PFA film | 6.6 ± 1.2 | E |
| KXP + PFA film | 5.7 ± 2.0 | F |
| KF + PTFE film | 6.8 ± 2.5 | G |
| KXP + PTFE film | 8.3 ± 3.3 | H |
| KF + FEP/20% glass | 10.2 ± 2.2 | I |
| KXP + FEP/20% glass | 8.2 ± 0.7 | J |
| KF + PTFE/20% glass | 9.4 ± 1.7 | K |
| KXP + PTFE/20% glass | 8.5 ± 1.6 | L |

TABLE II

AVERAGE DIMENSIONAL CHANGES WITH STANDARD DEVIATIONS OF FLUOROCARBON/KAPTON LAMINATES (%)

| | Total Change | | On Etch | | |
|---|---|---|---|---|---|
| | MD | TD | MD | TD | EXAMPLE |
| Kapton F (KF) | −0.370 ± 0.071 | −0.405 ± 0.090 | −0.359 ± 0.145 | −0.377 ± 0.118 | A |
| Kapton XP (KXP) | −0.573 ± 0.062 | −0.648 ± 0.120 | −0.786 ± 0.046 | −0.915 ± 0.109 | B |
| KF + FEP film | −0.594 ± 0.016 | −0.673 ± 0.025 | −1.143 ± 0.042 | −1.339 ± 0.052 | C |
| KF + PFA film | −0.718 ± 0.025 | −0.827 ± 0.020 | −1.443 ± 0.151 | −1.517 ± 0.078 | E |
| KF + PTFE film | −0.761 ± 0.050 | −0.880 ± 0.1050 | −1.297 ± 0.048 | −1.486 ± 0.038 | G |
| KXP + FEP film | −0.633 ± 0.021 | −0.714 ± 0.019 | −1.096 ± 0.015 | −1.290 ± 0.018 | D |
| KXP + PFA film | −1.014 ± 0.013 | −1.130 ± 0.021 | −1.561 ± 0.021 | −1.733 ± 0.021 | F |

TABLE II-continued
AVERAGE DIMENSIONAL CHANGES WITH STANDARD DEVIATIONS OF FLUOROCARBON/KAPTON LAMINATES (%)

| | Total Change | | On Etch | | |
|---|---|---|---|---|---|
| | MD | TD | MD | TD | EXAMPLE |
| KXP +PTFE film | −0.754 ± 0.064 | −0.905 ± 0.035 | −1.164 ± 0.124 | −1.375 ± 0.086 | H |
| KF + FEP/20% Glass | −0.022 ± 0.019 | −0.066 ± 0.017 | −0.053 ± 0.028 | −0.092 ± 0.033 | I |
| KXP + FEP/20% Glass | −0.050 ± 0.033 | −0.111 ± 0.006 | −0.106 ± 0.048 | −0.192 ± 0.013 | J |
| KF + PTFE/20% Glass | −0.109 ± 0.071 | −0.156 ± 0.014 | −0.203 ± 0.093 | −0.271 ± 0.029 | K |
| KXP + PTFE/20% Glass | −0.131 ± 0.064 | −0.161 ± 0.017 | −0.216 ± 0.076 | −0.258 ± 0.036 | L |

C. Temperature

It should be understood that the novel glass reinforced polyfluorocarbon laminate of the present invention does not adversely affect temperature characteristics. For example, laminates using Kapton XP as a base material and a glass reinforced fluoropolymer layer of PTFE passed a 550° F. solder float resistance test in accordance with IPC Test Method No. 2.4.13, Revision C, dated December 1982, and incorporated herein by reference.

II. ELECTRICAL PROPERTIES:

The contributions of the glass reinforced flouropolymer layer(s) to the improved electrical properties of the circuit laminate described herein is a significant feature of the present invention. As a signal pulse travels along a conductor in a circuit, the electrical and magnetic fields generated by the pulse extend into the dielectric materials surrounding the conductor. The fields are strongest at the conductor/dielectric interface and become weaker as distance from the conductor increases. The properties of the dielectric material closest to the conductor therefore have the greatest affect on these fields and hence on the electrical properties (propagation velocity, impedance, etc.) of the circuit.

A. Effective Dielectric Constant

This significant electrical characteristic of laminate circuit materials is clearly shown in the following TABLE III wherein the effective dielectric constant of stripline circuits using base substrates such as described in FIG. 1 (i.e., polyimide/acrylic adhesive/copper) and FIG. 2 (i.e., polyimide/flouropolymer/copper) are compared to the effective dielectric constant of a stripline circuit in accordance with the present invention (FIGS. 7 or 7A). Dielectric constant is a physical property, and therefore characteristic of a material. However, the effective dielectric constant ($\epsilon$eff) as measured by the TDR technique gives a dielectric constant value for the material in which the electrical and magnetic fields of the signal pulse travel. In the stripline configuration, these fields are contained in the dielectric material between the ground planes. Therefore, the stripline values for effective dielectric constant are closest to the dielectric constant of the substrate. In microstrip and coplanar constructions, the electrical and magnetic fields extend into air. The microstrip and coplanar values of $\epsilon$eff reflect the combination of the dielectric constants of air ($\epsilon_r \approx 1$) and the dielectric material. In the coplanar construction, the contribution of air is dominant. TABLE III shows that a significantly lower effective dielectric constant (relative to the FIG. 1 laminate) results with the present invention due to the glass reinforced fluorocarbon layer while the same (relatively low) dielectric constant as is found in the FIG. 2 laminate is provided.

TABLE III
Effective Dielectric Constant ($\epsilon$ eff) for Stripline Circuit Constructions

| Substrate | $\epsilon$ eff |
|---|---|
| Kapton + Acrylic Adhesive (FIG. 1) | 3.1 |
| Kapton XP (FIG. 2) | 2.5 |
| Kapton + glass reinforced fluorocarbon (FIG. 7 or 7A) | 2.5 |

B. Characteristic Impedance

The characteristic impedance (Zo) of a conductor in a circuit is a function of the width of the conductor, the dielectric thickness (between the conductor and the ground), and the electrical properties of the dielectric material. FIG. 10 is a graph plotting characteristic impedance vs. line width for stripline and microstrip constructions of a circuit laminate in accordance with the present invention and a laminate material similar to the prior art laminate of FIG. 1. The results set forth in FIG. 10 indicate at least the following:
  (a) Zo increases with decreasing line width
  (b) Characteristic impedance of a given conductor is higher in microstrip than in stripline construction.
  (c) For the same line width and dielectric thickness the lower the $\epsilon$eff the higher is the characteristic impedance. Therefore, lower $\epsilon$eff materials such as the circuit laminate of the present invention, have an advantage in circuit manufacturing (the subtractive process) because they can meet impedance specifications using wider lines, which are easier to manufacture.

C. RISE TIME

One source of signal distortion in circuits is the degradation of signal rise time caused by attenuation of high frequency components of the signal pulse. In FIG. 11, output signal rise time of a 50 cm circuit using a 60 picosecond rise time input signal is plotted as a function of line width for the laminate of FIG. 1 and a laminate in accordance with the present invention. The circuits in accordance with the present invention (with glass reinforced fluoropolymer in the dielectric) have shorter rise times than the FIG. 1 circuit for all line widths, indicating lower signal distortion.

In summary, the glass reinforced fluoropolymer layer of the present invention laminated with a fluoropolymer coated polyimide such as Kapton F or Kapton XP will provide dramatic improvements and features over both prior art circuit laminates shown in FIGS. 1 and 2. Thus, when compared to the polyimide/adhesive/copper laminate (adhesives as related here are conventional commercially available adhesive which generically are acrylics or epoxies) of FIG. 1, the laminate of the present invention provides:
  (1) a lower dielectric constant;
  (2) as good or better peel strength between the copper and polyimide substrate;

(3) as good or better dimensional stability;
(4) as good or better temperature characteristics;
(5) higher (improved) characteristic impedance; and
(6) shorter (improved) rise times.

Moreover, when compared to the polyimide/-fluoropolymer/copper laminate of FIG. 2, the laminate of the present invention provides:

(1) greatly improved bond or peel strength between the copper and fluoropolymer;
(2) greatly improved dimensional stability;
(3) as good or better temperature characteristics; and
(4) as good dielectric constant, characteristic impedance and rise times.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A laminated circuit material comprising:
a first layer of polyimide film;
a first layer of fluoropolymer film on said first layer of polyimide film, said first layer of polyimide film and said first layer of fluoropolymer film defining a circuit substrate;
a first glass reinforced fluoropolymer adhesive film on said first layer of fluoropolymer film, said glass having a short, noncontinuous configuration; and
a first sheet of conductive material disposed on at least a portion of said glass reinforced fluoropolymer adhesive film.

2. The circuit material of claim 1 wherein:
said first conductive sheet means is copper.

3. The circuit material of claim 1 wherein:
said first layer of glass reinforced fluoropolymer adhesive film has between about 4 to about 30 weight percent glass.

4. The circuit material of claim 1 wherein:
said glass is microglass.

5. The circuit material of claim 1 wherein:
said first layer of glass reinforced fluoropolymer adhesive film is between about 1 to about 10 mils in thickness.

6. The circuit material of claim 1 wherein:
said first layer of glass reinforced fluoropolymer adhesive film is a fluoropolymer film selected from the group comprising polytetrafluoroethylene, fluorinated ethylene-propylene copolymer and a fluorocarbon backbone with perfluoroalkoxy side chains.

7. The circuit material of claim 6 wherein:
said first layer of glass reinforced fluoropolymer film has between about 4 to about 30 weight percent glass.

8. The circuit material of claim 7 wherein:
said glass is microglass.

9. The circuit material of claim 1 including:
a second layer of fluoropolymer film disposed on the side of said first layer of polyimide film opposite said first layer of fluoropolymer film.

10. The circuit material of claim 9 including:
a second sheet of conductive material disposed on at least a portion of said second layer of fluoropolymer film.

11. The circuit material of claim 10 wherein:
said conductive material is copper.

12. The circuit material of claim 10 including:
a second layer of glass reinforced fluoropolymer adhesive film disposed between said second sheet of conductive material and said second layer of fluoropolymer film, said glass having a short, noncontinuous configuration.

13. A laminated circuit material comprising:
a first layer of polyimide film;
a first layer of fluoropolymer film on said first layer of polyimide film, said first layer of polyimide film and said first layer of fluoropolymer film defining a circuit substrate;
a first glass reinforced fluoropolymer adhesive film on said first layer of fluoropolymer film, said glass having a short, noncontinuous configuration;
a first sheet of conductive material disposed on at least a portion of said glass reinforced fluoropolymer adhesive film;
a second layer of glass reinforced fluoropolymer adhesive film disposed on the side of said first sheet of conductive material opposite said first layer of glass reinforced fluoropolymer adhesive film, said glass having a short, noncontinuous configuration;
a second layer of fluoropolymer film disposed on said second layer of glass reinforced fluoropolymer adhesive film; and
a second layer of polyimide film disposed on said second layer of fluoropolymer film.

14. The circuit material of claim 13 including:
a third layer of fluoropolymer film disposed on the side of said first layer of polyimide film opposite said first layer of fluoropolymer film.

15. The circuit material of claim 14 including:
a second sheet of conductive material disposed on at least a portion of said third layer of fluoropolymer film.

16. The circuit material of claim 15 wherein:
said conductive material is copper.

17. The circuit material of claim 15 including:
a third layer of glass reinforced fluoropolymer adhesive film disposed between said second sheet of conductive material and said third layer of fluoropolymer film, said glass having a short, noncontinuous configuration.

18. The circuit material of claim 15 including:
a fourth layer of fluoropolymer film disposed on the side of said second layer of polyimide film opposite said second layer of fluoropolymer film.

19. The circuit material of claim 18 including:
a third sheet of conductive material disposed on at least a portion of said fourth layer of fluoropolymer film.

20. The circuit material of claim 19 wherein:
said conductive material is copper.

21. A laminated circuit material comprising:
a first layer of polyimide film;
a first layer of fluoropolymer film on said first layer of polyimide film;
a first glass reinforced fluoropolymer adhesive film on said first layer of fluoropolymer film, said glass having a short, noncontinuous configuration;
a first sheet of conductive material disposed on at least a portion of said glass reinforced fluoropolymer adhesive film;
a second layer of glass reinforced fluoropolymer adhesive film disposed on the side of said first sheet of conductive material opposite said first layer of glass reinforced fluoropolymer adhesive film, said glass having a short, noncontinuous configuration;

a second layer of fluoropolymer film disposed on said second layer of glass reinforced fluoropolymer adhesive film;

a second layer of polyimide film disposed on said second layer of fluoropolymer film;

a third layer of fluoropolymer film disposed on the side of said first layer of polyimide film opposite said first layer of fluoropolymer film;

a second sheet of conductive material disposed on at least a portion of said third layer of fluoropolymer film;

a fourth layer of fluoropolymer film disposed on the side of said second layer of polyimide film opposite said second layer of fluoropolymer film;

a third sheet of conductive material disposed on at least a portion of said fourth layer of fluoropolymer film;

a third layer of glass reinforced fluoropolymer adhesive film disposed between said second sheet of conductive material and said third layer of fluoropolymer film, said glass having a short, noncontinuous configuration; and a fourth layer of glass reinforced fluoropolymer adhesive film disposed between said third sheet of conductive material and said fourth layer of fluoropolymer film, said glass having a short, noncontinuous configuration.

22. The circuit material of claim 21 wherein:
said glass is microglass.

* * * * *